(12) United States Patent
Park et al.

(10) Patent No.: US 11,004,608 B2
(45) Date of Patent: May 11, 2021

(54) COMPOSITE ELECTRONIC COMPONENT

(71) Applicant: SAMSUNG ELECTRO-MECHANICS CO., LTD., Suwon-si (KR)

(72) Inventors: Heung Kil Park, Suwon-Si (KR); Se Hun Park, Suwon-Si (KR); Gu Won Ji, Suwon-Si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 150 days.

(21) Appl. No.: 16/202,900

(22) Filed: Nov. 28, 2018

(65) Prior Publication Data
US 2019/0326060 A1   Oct. 24, 2019

(30) Foreign Application Priority Data

Apr. 19, 2018   (KR) .......................... 10-2018-0045611

(51) Int. Cl.
| | |
|---|---|
| *H01G 4/228* | (2006.01) |
| *H01G 2/06* | (2006.01) |
| *H01G 4/30* | (2006.01) |
| *H01G 4/12* | (2006.01) |
| *H05K 1/02* | (2006.01) |

(52) U.S. Cl.
CPC ................ *H01G 4/30* (2013.01); *H01G 2/06* (2013.01); *H01G 4/12* (2013.01); *H01G 4/228* (2013.01); *H05K 1/0271* (2013.01); *H05K 2201/2045* (2013.01)

(58) Field of Classification Search
CPC .. H01G 4/30; H01G 2/06; H01G 4/12; H01G 4/228; H05K 1/0271; H05K 2201/2045
See application file for complete search history.

(56) References Cited

U.S. PATENT DOCUMENTS

| | | | |
|---|---|---|---|
| 10,542,626 B2* | 1/2020 | Kim ..................... | H05K 3/3442 |
| 2013/0284507 A1* | 10/2013 | Hattori ................. | H05K 1/181 |
| | | | 174/260 |
| 2014/0016242 A1 | 1/2014 | Hattori et al. | |
| 2014/0041914 A1* | 2/2014 | Hattori .................. | H01G 2/065 |
| | | | 174/260 |

(Continued)

FOREIGN PATENT DOCUMENTS

| | | |
|---|---|---|
| JP | 5012658 B2 | 8/2012 |
| JP | 2012-204572 A | 10/2012 |

(Continued)

*Primary Examiner* — Dion Ferguson
(74) *Attorney, Agent, or Firm* — Morgan, Lewis & Bockius LLP

(57) ABSTRACT

A composite electronic component includes a multilayer ceramic capacitor including a ceramic body configured by stacking a plurality of dielectric layers and configured by stacking a plurality of internal electrodes facing each other with the dielectric layer interposed therebetween and first and second external electrodes disposed on opposing end portions of the ceramic body, and a pair of substrates spaced apart from a lower portion of the multilayer ceramic capacitor and each including, on opposing end portions, first terminal electrodes connected to the first external electrode and second terminal electrodes connected to the second external electrode.

18 Claims, 8 Drawing Sheets

(56) References Cited

U.S. PATENT DOCUMENTS

| | | | | |
|---|---|---|---|---|
| 2014/0138136 A1* | 5/2014 | Ahn | ............... | H05K 3/3442 |
| | | | | 174/260 |
| 2015/0041195 A1* | 2/2015 | Ahn | ............... | H05K 1/0306 |
| | | | | 174/260 |
| 2016/0088733 A1* | 3/2016 | Lee | ............... | H05K 1/144 |
| | | | | 361/768 |
| 2016/0088735 A1* | 3/2016 | Park | ............... | H05K 1/181 |
| | | | | 361/782 |
| 2016/0120027 A1* | 4/2016 | Park | ............... | H01G 4/012 |
| | | | | 174/260 |
| 2016/0217926 A1* | 7/2016 | Jun | ............... | H01G 4/228 |
| 2016/0336114 A1* | 11/2016 | Nishimura | ............... | H01G 2/06 |
| 2017/0186545 A1* | 6/2017 | Nishimura | ............... | H01G 4/30 |
| 2018/0323010 A1* | 11/2018 | Park | ............... | H01G 2/065 |
| 2019/0378656 A1* | 12/2019 | Sim | ............... | H01G 4/30 |
| 2020/0118744 A1* | 4/2020 | Sim | ............... | H01G 4/30 |
| 2020/0135402 A1* | 4/2020 | Park | ............... | H01G 4/12 |

FOREIGN PATENT DOCUMENTS

| | | |
|---|---|---|
| JP | 06-084687 B2 | 2/2017 |
| KR | 10-2016-0090489 A | 8/2016 |

\* cited by examiner

COMPOSITE ELECTRONIC COMPONENT

CROSS-REFERENCE TO RELATED APPLICATION(S)

This application claims the benefit of priority to Korean Patent Application No. 10-2018-0045611 filed on Apr. 19, 2018, in the Korean Intellectual Property Office, the disclosure of which is incorporated herein by reference in its entirety.

TECHNICAL FIELD

The present disclosure relates to a composite electronic component.

BACKGROUND

A multilayer ceramic capacitor (MLCC), a type of stacked chip electronic component, is a chip-type capacitor mounted on the circuit boards of various electronic products such as an image display device, i.e., a liquid crystal display (LCD) and a plasma display panel (PDP), a computer, a personal digital assistant (PDA), a cellular phone, and the like, serving to charge and discharge electricity.

Such a multilayer ceramic capacitor may be used as a component in various electronic devices, due to advantages thereof, whereby the MLCC is easily mountable while having a small size and high capacity ensured therein.

Such an MLCC includes a plurality of dielectric layers and internal electrodes having different polarities, alternately stacked between the dielectric layers.

Since such a dielectric layer has piezoelectric and piezoresistive properties, a piezoelectric phenomenon may occurs between the internal electrodes when a direct current (DC) or alternating current (AC) voltage is applied to the MLCC and, thus, vibrations may be generated.

Such vibrations may be transferred to a circuit board having the MLCC mounted thereon through external electrodes of the MLCC to generate vibration sound, as the entire circuit board may function as an acoustic reflective surface.

The vibration sound may correspond to an audio frequency in the range of 20 to 20,000 Hz, which may cause discomfort in humans, and the vibration sound which causes discomfort in humans is referred to as acoustic noise.

Recently, as electronic devices have been used in environments in which high voltages and large changes in voltage are present, along with a printed circuit board, due to the slimming and miniaturization of electronic devices, acoustic noise is present in a level sufficiently recognizable by a user.

Accordingly, in accordance with current trends, there has been a continuous need for a new product having reduced acoustic noise.

SUMMARY

An aspect of the present disclosure may provide a composite electronic component having reduced acoustic noise.

According to an aspect of the present disclosure, a composite electronic component may include a multilayer ceramic capacitor including a ceramic body configured by stacking a plurality of dielectric layers and configured by stacking a plurality of internal electrodes facing each other with the dielectric layer interposed therebetween and first and second external electrodes disposed on opposing end portions of the ceramic body, and a pair of substrates spaced apart from a lower portion of the multilayer ceramic capacitor and each including, on opposing end portions, first terminal electrodes connected to the first external electrode and second terminal electrodes connected to the second external electrode.

According to another aspect of the present disclosure, a composite electronic component may include a multilayer ceramic capacitor including a ceramic body configured by stacking a plurality of dielectric layers and configured by stacking a plurality of internal electrodes facing each other with the dielectric layer interposed therebetween and first and second external electrodes disposed on opposing end portions of the ceramic body, and a pair of first terminal electrodes connected to a first external electrode, and including a substrate disposed therein, and a pair of second terminal electrodes connected to the second external electrodes and including a substrate disposed therein, the pair of first terminal electrodes and the pair of second terminal electrodes being disposed below the multilayer ceramic capacitor.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
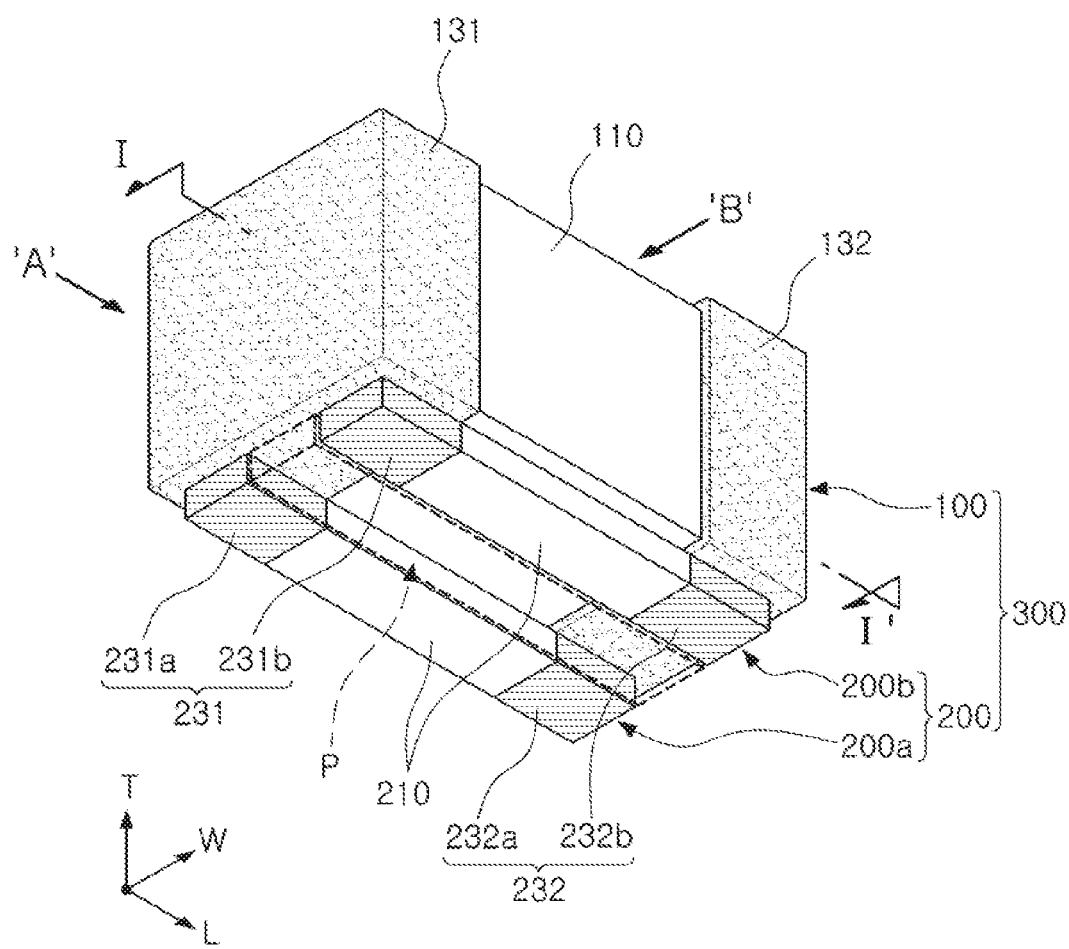
FIG. 1 is a schematic perspective view of a composite electronic component according to a first exemplary embodiment of the present disclosure.

Hereinafter, exemplary embodiments of the present disclosure will be described in detail with reference to the accompanying drawings. In the accompanying drawings, shapes, sizes, and the like, of components may be exaggerated or stylized for clarity.

The present disclosure may, however, be exemplified in many different forms and should not be construed as being limited to the specific embodiments set forth herein. Rather these embodiments are provided so that this disclosure will be thorough and complete, and will fully convey the scope of the disclosure to those skilled in the art.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

The meaning of a "connection" of a component to another component in the description includes an indirect connection through a third component as well as a direct connection between two components. In addition, "electrically connected" means the concept including a physical connection and a physical disconnection. It can be understood that when an element is referred to with "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

Herein, an upper portion, a lower portion, an upper side, a lower side, an upper surface, a lower surface, and the like, are decided in the accompanying drawings. In addition, a vertical direction refers to the abovementioned upward and downward directions, and a horizontal direction refers to a direction perpendicular to the abovementioned upward and downward directions. In this case, a vertical cross section refers to a case taken along a plane in the vertical direction, and an example thereof may be a cross-sectional view illustrated in the drawings. In addition, a horizontal cross section refers to a case taken along a plane in the horizontal direction, and an example thereof may be a plan view illustrated in the drawings.

Terms used herein are used only in order to describe an exemplary embodiment rather than limiting the present disclosure. In this case, singular forms include plural forms unless interpreted otherwise in context.

Composite Electronic Component

FIG. 1 is a schematic perspective view of a composite electronic component according to a first exemplary embodiment of the present disclosure.

Figure 2:
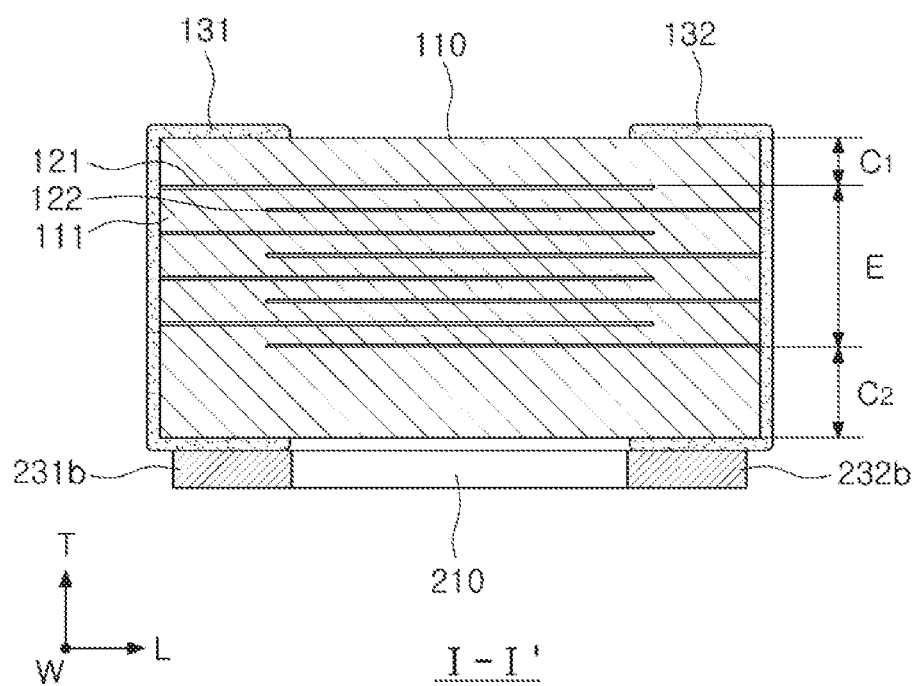
FIG. 2 is a cross-sectional view of another example of the composite electronic component taken along a line of I-I' of FIG. 1.

FIG. 2 is a cross-sectional view of another example of the composite electronic component taken along a line of I-I' of FIG. 1.

Referring to FIG. 1, in the composite electronic component according to an exemplary embodiment of the present disclosure, the 'longitudinal direction' or 'length direction' is defined as an 'L' direction of FIG. 1, the 'width direction' is defined as a 'W' direction of FIG. 1, and the 'thickness direction' is defined as a 'T' direction of FIG. 1. Here, the 'thickness direction' may be used as the same concept as a direction in which dielectric layers of a capacitor are stacked, that is, the 'stack direction' or 'stacking direction'.

The composite electronic component according to an exemplary embodiment of the present disclosure may have upper and lower surfaces that face each other, and longitudinal-direction first and second lateral surfaces and width-direction third and fourth lateral surfaces, which connect the upper and lower surfaces. A shape of the composite electronic component is not particularly limited but may have a hexahedral shape illustrated in the drawing.

The longitudinal-direction first and second lateral surfaces and the width-direction third and fourth lateral surfaces of the composite electronic component may be defined as surfaces with the same direction as longitudinal-direction first and second lateral surfaces and width-direction third and fourth lateral surfaces of a multilayer ceramic capacitor and a pair of substrates, as described later.

The composite electronic component may be formed by coupling a multilayer ceramic capacitor and a pair of substrates and, in this regard, when the pair of substrate is coupled to a lower portion of the multilayer ceramic capacitor, an upper surface of the composite electronic component may be defined as an upper surface of the multilayer ceramic capacitor and a lower surface of the composite electronic component may be defined as a lower surface of the pair of substrates.

Referring to FIGS. 1 and 2, a composite electronic component 300 according to the first exemplary embodiment of the present disclosure may include a multilayer ceramic capacitor 100 including a ceramic body 110 configured by stacking a plurality of dielectric layers 111 and first and second internal electrodes 121 and 122 that face each other across the dielectric layer 111 and first and second external electrodes 131 and 132 disposed on opposing end portions of the ceramic body 110, and a pair of substrates 200 spaced apart from a lower portion of the multilayer ceramic capacitor 100 and each including, on opposing end portions, first terminal electrodes 231, 231a, and 231b connected to the first external electrode 131 and second terminal electrodes 232, 232a, and 232b connected to the second external electrode 132.

In detail, the pair of substrates 200 may include a first substrate 200a including, on opposing end portions, a first substrate 200a including the first terminal electrode 231a connected to the first external electrode 131 and the second terminal electrode 232a connected to the second external electrode 132, and a second substrate 200b including, on opposing end portions, the first terminal electrode 231b connected to the first external electrode 131 and the second terminal electrode 232b connected to the second external electrode 132.

The first substrate 200a and the second substrate 200b may include the first terminal electrodes 231a and 231b and the second terminal electrodes 232a and 232b arranged on opposing end portions of an insulating substrate 210 manufactured of ceramic in bulk form.

That is, the first substrate 200a may include the first terminal electrode 231a and the second terminal electrode 232a arranged on opposing end portions of the insulating substrate 210 and, in this case, the first terminal electrode 231a may be connected to the first external electrode 131 and the second terminal electrode 232a may be connected to the second external electrode 132 with different polarity from the first external electrode.

The second substrate 200b may include the first terminal electrode 231b and the second terminal electrode 232b arranged on opposing end portions of the insulating substrate 210 and, in this case, the first terminal electrode 231b may be connected to the first external electrode 131 and the second terminal electrode 232b may be connected to the second external electrode 132 with different polarity from the first external electrode.

That is, the first substrate 200a and the second substrate 200b may each have first and second electrodes connected to the first external electrode 131 and the second external electrode 132 with different polarities.

The insulating substrate 210 may be manufactured of an elastic material as a resin generally used to manufacture a substrate and may absorb vibrations of the multilayer ceramic capacitor with elasticity of the insulating substrate 210.

According to another exemplary embodiment of the present disclosure, the insulating substrate 210 is manufactured using alumina ($Al_2O_3$) and, thus, vibration generated from the multilayer ceramic capacitor 100 may be originally prevented.

According to another exemplary embodiment of the present disclosure, the insulating substrate 210 may include a paraelectric material.

Since the paraelectric material has no piezoelectric properties, vibrations generated from the multilayer ceramic capacitor 100 may be originally prevented and, thus, the pair of substrates 200 including the insulating substrate 210 including the paraelectric material may be disposed below the multilayer ceramic capacitor 100, thereby lowering acoustic noise.

The first and second terminal electrodes 231 and 232 may have a bilayer structure of internal first and second conductive resin layers and external first and second plating layers.

According to the first exemplary embodiment of the present disclosure, as described above, when the first and second terminal electrodes 231 and 232 have a bilayer structure of internal first and second conductive resin layers and external first and second plating layers, if mechanical stress is applied from the outside, stress may be prevented from being transferred to the multilayer ceramic capacitor 100 due to the conductive resin layer used as the pair of substrates 200 and the terminal electrodes 231 and 232 thereof, thereby preventing the multilayer ceramic capacitor from cracking.

The first and second conductive resin layers may include, but are not limited to, conductive metal and thermosetting resin but is not limited thereto and, for example, may include silver (Ag) and epoxy resin.

First and second terminal electrodes 231 and 232 may be disposed at entire end portions of the second ceramic body 210 opposing each other in the longitudinal direction.

The first and second terminal electrodes 231 and 232 are disposed at the entire end portions of the second ceramic body 210 opposing each other in the longitudinal direction and, thus, fixing force with the external electrodes 131 and 132 of the multilayer ceramic capacitor may be enhanced.

The first substrate 200a and the second substrate 200b may have a bar type but are not limited thereto.

The first substrate 200a and the second substrate 200b configuring the pair of substrates 200 may be disposed below the multilayer ceramic capacitor 100 to be spaced apart from each other.

The first substrate 200a and the second substrate 200b may be disposed below the multilayer ceramic capacitor 100 and may be spaced apart from each other in the width-direction of the multilayer ceramic capacitor 100.

That is, first substrate 200a and the second substrate 200b configuring the pair of substrates 200 may each have a bar type disposed in the longitudinal direction of the multilayer ceramic capacitor 100.

The internal electrode may include the first and second internal electrodes 121 and 122 and, the first and second internal electrodes 121 and 122 may be disposed in parallel to the upper and lower surfaces of the first ceramic body 110.

In general, when different voltages with different polarities are applied to the first and second electrodes formed at opposite portions of the multilayer ceramic capacitor, the ceramic body expands and contracts in the thickness direction according to an inverse piezoelectric effect of a dielectric layer, and longitudinal-direction opposing end portions of the first and second external electrodes may contract and expand according to the Poisson effect, oppositely to expansion and contraction of the ceramic body in the thickness direction.

According to an exemplary embodiment of the present disclosure, the first substrate 200a and the second substrate 200b configuring the pair of substrates 200 each have a bar type disposed in the longitudinal direction of the multilayer ceramic capacitor 100 and, thus, an effect of alleviating stress or vibrations due to the piezoelectricity of the multilayer ceramic capacitor may be excellent compared with arrangement in which a planar ceramic substrate or interposer substrate is disposed below a multilayer ceramic capacitor a general composite electronic component.

That is, stress or vibrations due to the piezoelectricity of the multilayer ceramic capacitor may be alleviated by a pair of substrates spaced apart from each other below the multilayer ceramic capacitor, thereby remarkably reducing a size of acoustic noise generated from a circuit board.

The first internal electrode 121 and the second internal electrode 122 may be disposed in parallel to the upper and lower surfaces of the ceramic body 110 but the present disclosure is not limited thereto and, for example, the first internal electrode 121 and the second internal electrode 122 may be disposed perpendicularly to the upper and lower surfaces of the ceramic body 110. When the first internal electrode 121 and the second internal electrode 122 are disposed on a lower surface, that is, a mounting surface of the ceramic body 110, an effect of reducing ESL may be excellent.

A space 'P' penetrating in the longitudinal direction of the ceramic body 110 may be disposed between the pair of substrates 200.

That is, the first substrate 200a and the second substrate 200b may be spaced apart from each other in the width direction of the multilayer ceramic capacitor 100 and the space 'P' penetrating in the longitudinal direction of the ceramic body 110 may be disposed between the first substrate 200a and the second substrate 200b.

The space 'P' penetrating in the longitudinal direction of the ceramic body 110 may be disposed between the pair of substrates 200 and, thus, solder may be prevented from being formed in the thickness direction of the multilayer ceramic capacitor, thereby minimizing transfer of vibrations to the substrate via solder.

When the composite electronic component 300 is installed on a printed circuit board, solder coated to connect an electrode pad on the printed circuit board and the composite electronic component is filled in the space 'P' penetrating between the pair of substrates 200 and, thus, may be prevented from being formed along the external electrode of the multilayer ceramic capacitor 100.

That is, according to an exemplary embodiment of the present disclosure, the space 'P' penetrating between the pair of substrates 200, which is to be defined as solder pocket, may be generated.

In this case, when the composite electronic component according to the first exemplary embodiment of the present disclosure is mounted on a substrate and solder is coated, while most portions of solder are filled in the space 'P' penetrating between the pair of substrates 200, the remaining portions of the solder may be coated on lower surfaces of the first and second external electrodes 131 and 132 of the multilayer ceramic capacitor 100 and lateral surfaces of the first and second terminal electrodes 231 and 232 of the pair of substrates 200.

An amount of the solder coated on the lower surfaces of the first and second external electrodes 131 and 132 of the multilayer ceramic capacitor 100 and the lateral surfaces of the first and second terminal electrodes 231 and 232 of the pair of substrates 200 is small compared with a conventional structure and, thus, transfer of vibrations to a substrate via solder may be minimized.

Referring to FIG. 2, the composite electronic component according to another exemplary embodiment of the present disclosure, the ceramic body 110 may include an active region E with capacity formed disposing the internal electrodes 121 and 122 to face each other across the dielectric layer 111, and an upper cover layer C1 and a lower cover layer C2 formed above and below the active region E in the thickness direction and, in this case, a lower thickness-direction portion is thicker than an upper thickness-direction portion.

Here, a central portion of the active region E expands and contracts to a maximum degree on opposing end portions in the longitudinal direction of first and second external electrodes 131 and 132, which generates acoustic noise.

According to the present embodiment, to reduce acoustic noise, the thickness of the lower cover layer C2 may be greater than the thickness of the upper cover layer C1 in such a manner that the central portion of the active region E deviates from the central portion of the ceramic body 110.

Accordingly, transfer of stress and vibrations generated from the multilayer ceramic capacitor may be minimized, thereby reducing acoustic noise.

Figure 3:
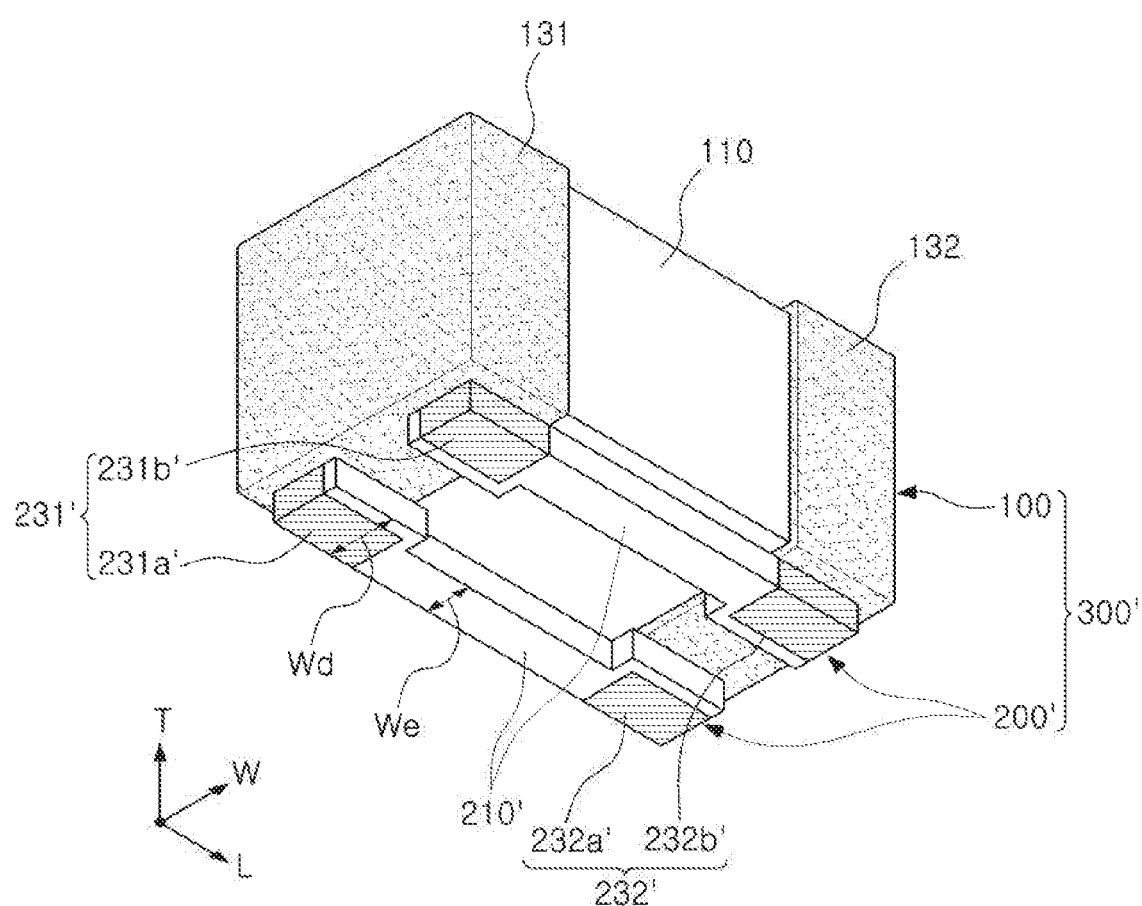
FIG. 3 is a schematic perspective view of a composite electronic component according to a second exemplary embodiment of the present disclosure.

FIG. 3 is a schematic perspective view of a composite electronic component according to a second exemplary embodiment of the present disclosure.

Referring to FIG. 3, in each of a pair of substrates 200' spaced apart from each other below the multilayer ceramic capacitor 100 of a composite electronic component 300' according to a second exemplary embodiment of the present disclosure, a width Wd of a region in which first terminal electrodes 231', 231a', and 231b' and second terminal electrodes 232', 232a', and 232b' are disposed may be greater than a width We of an insulating substrate 210' of an internal region in which the first and second terminal electrodes 231' and 232' are not disposed.

The width We of the internal region 210' of the pair of substrates 200' on which the first and second terminal electrodes 231' and 232' are not disposed is smaller than the width Wd of the region in which the first terminal electrodes 231', 231a', and 231b' and the second terminal electrodes 232', 232a', and 232b' are disposed and, thus, vibrations in a region in which the first terminal electrodes 231', 231a', and 231b' and the second terminal electrodes 232', 232a', and 232b' are disposed may not be transferred to the insulating substrate 210' of the internal region, thereby effectively preventing acoustic noise from being generated.

The first terminal electrodes 231', 231a', and 231b' and the second terminal electrodes 232', 232a', and 232b' may be partially disposed on end portions opposing in the longitudinal direction of each of the pair of substrates 200'.

The first terminal electrodes 231', 231a', and 231b' and the second terminal electrodes 232', 232a', and 232b' may be partially disposed on the opposing end portions in the longitudinal direction of each of the pair of substrates 200' and, thus, solder may be easily filled in a space formed between the pair of substrates 200' and, thus, may be prevented from being formed along the external electrodes 131 and 132 of the multilayer ceramic capacitor 100.

Figure 4:
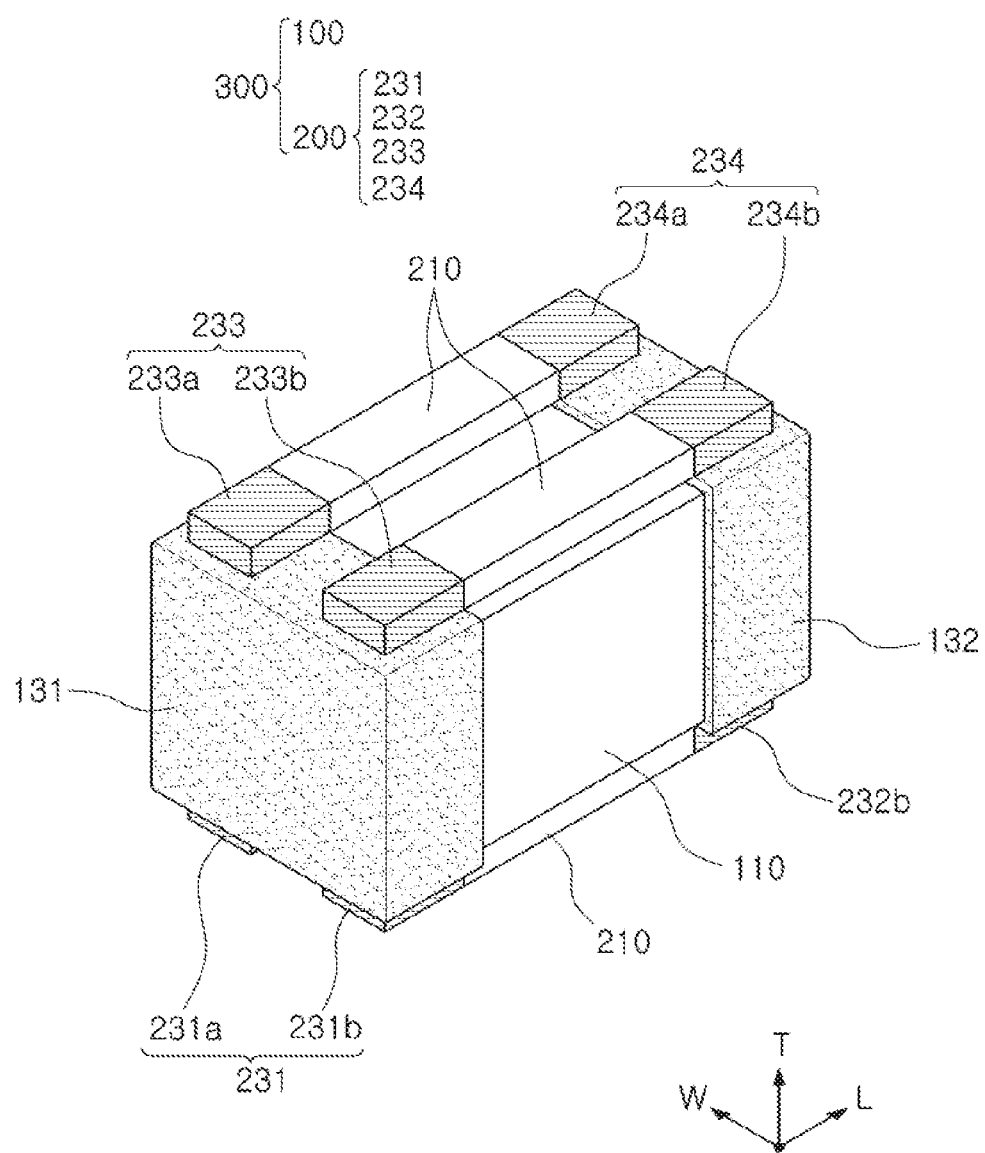
FIG. 4 is a schematic perspective view of a composite electronic component according to a third exemplary embodiment of the present disclosure.

FIG. 4 is a schematic perspective view of a composite electronic component according to a third exemplary embodiment of the present disclosure.

Referring to FIG. 4, the composite electronic component according to the third exemplary embodiment of the present disclosure may be configured in such a manner that the pair of substrates 200 each including, on opposing end portions, the first terminal electrodes 231, 231a, and 231b connected to the first external electrode 131 and the second terminal electrodes 232, 232a, and 232b connected to the second external electrode 132 are disposed below the multilayer ceramic capacitor 100 (i.e., on a bottom surface of the multilayer ceramic capacitor) and may further include another pair of substrates 200 disposed on the surface opposite to the surface, on which the pair of substrates 200 is disposed (i.e., top surface), to be spaced apart from each other and each include, on opposing end portions, first terminal electrodes 233, 233a, and 233b connected to the first external electrode 131 and second terminal electrodes 234, 234a, and 234b connected to the second external electrode 132.

The first terminal electrodes 231 and 233 and the second terminal electrodes 232 and 234 may be partially disposed on opposite end portions in the longitudinal direction of the pair of substrates 200 respectively disposed above and below the multilayer ceramic capacitor 100.

According to the present embodiment, a method of coupling the multilayer ceramic capacitor 100 and the pair of substrates 200 is not particularly limited.

For example, the multilayer ceramic capacitor 100 and the pair of substrates 200 separately manufactured may be coupled via a high melting-point solder, conductive adhesives, or the like.

The conductive adhesives may have a paste type including conductive metal and epoxy resin but are not limited thereto.

Figure 5:
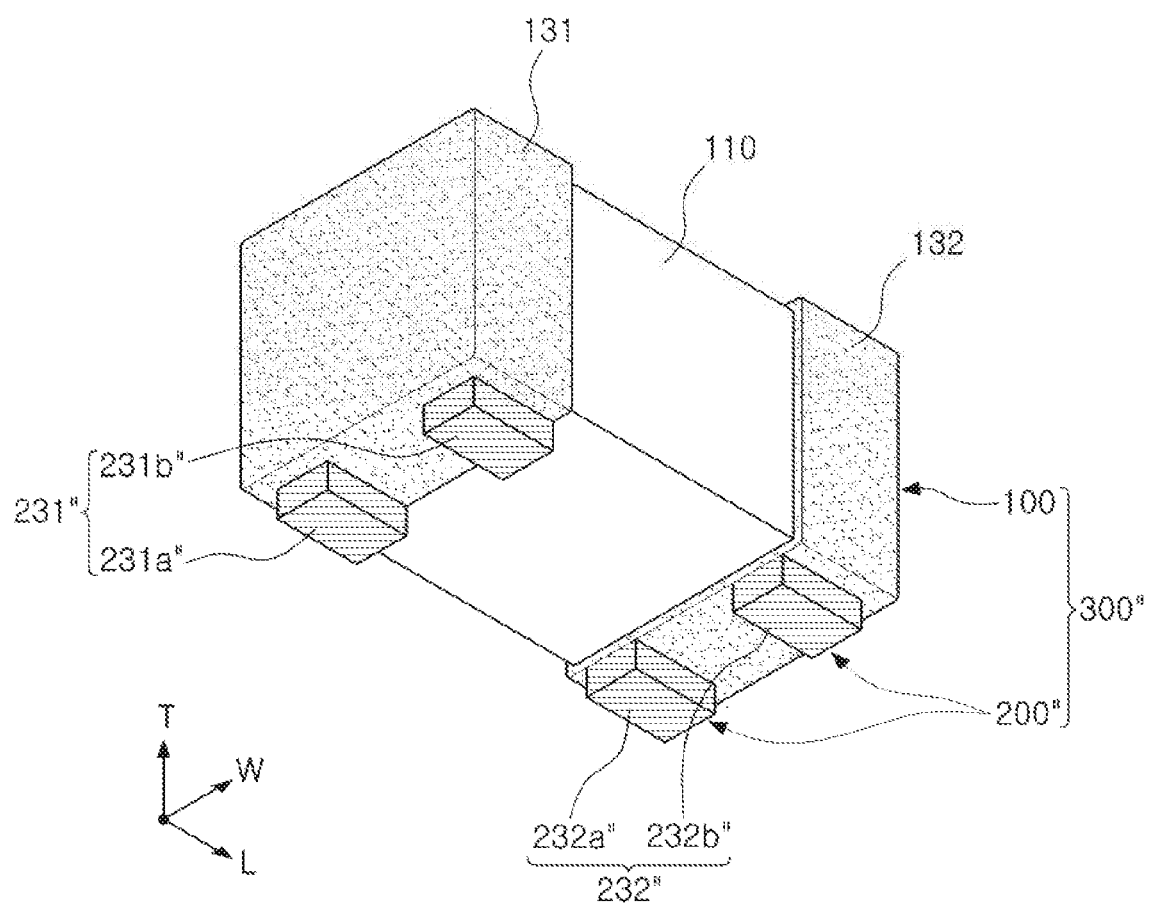
FIG. 5 is a schematic perspective view of a composite electronic component according to a fourth exemplary embodiment of the present disclosure.

FIG. 5 is a schematic perspective view of a composite electronic component according to a fourth exemplary embodiment of the present disclosure.

Referring to FIG. 5, a composite electronic component 300" according to a fourth exemplary embodiment of the present disclosure may include the multilayer ceramic capacitor 100 including the ceramic body 110 configured by stacking the plurality of dielectric layers 111 and the first and second internal electrodes 121 and 122 that face each other across the dielectric layer 111, and a pair of first terminal electrodes 231", 231a", and 231b" connected to the first external electrode 131 and including a substrate 200" disposed therein and a pair of second terminal electrodes 232", 232a", and 232b" connected to the second external electrode 132 and including the substrate 200" disposed therein, which are disposed below the multilayer ceramic capacitor 100.

In detail, the pair of first terminal electrodes 231", 231a", and 231b" may be connected to the first external electrode 131 and may be spaced apart from each other in the width direction of the ceramic body 110 and the pair of second terminal electrodes 232", 232a", and 232b" may be connected to the second external electrode 132 and may be spaced apart from each other in the width direction of the ceramic body 110.

The substrate 200" may be manufactured of ceramic and may be disposed in each of the first terminal electrodes 231", 231a", and 231b" and the second electrodes 232", 232a", and 232b".

That is, the first terminal electrodes 231", 231a", and 231b" and the second electrodes 232", 232a", and 232b" may be entirely disposed on a portion of the substrate 200" disposed therein.

The first terminal electrodes 231", 231a", and 231b" may be connected to the first external electrode 131 and the second electrodes 232", 232a", and 232b" may be connected to the second external electrode 132 with different polarity from the first external electrode 131.

That is, the first and second terminal electrodes may be connected to the first external electrode 131 and the second external electrode 132 with different polarities, respectively.

According to the fourth exemplary embodiment of the present disclosure, the pair of first terminal electrodes 231", 231a", and 231b" and the pair of second terminal electrodes 232", 232a", and 232b" may be disposed below the multilayer ceramic capacitor 100 and, thus, a space formed in the longitudinal and width directions of the ceramic body 110 may be disposed between each of the pair of first terminal electrodes 231", 231a", and 231b" and each of the pair of second terminal electrodes 232", 232a", and 232b".

A space formed in the longitudinal direction and the width direction of the ceramic body 110 may be disposed between each of the pair of first terminal electrodes 231", 231a", and 231b" and each of the pair of second terminal electrodes 232", 232a", and 232b" and, thus, solder may be prevented from being formed in the thickness direction of the multilayer ceramic capacitor, thereby minimizing transfer of vibrations to the substrate via solder.

Figure 6:
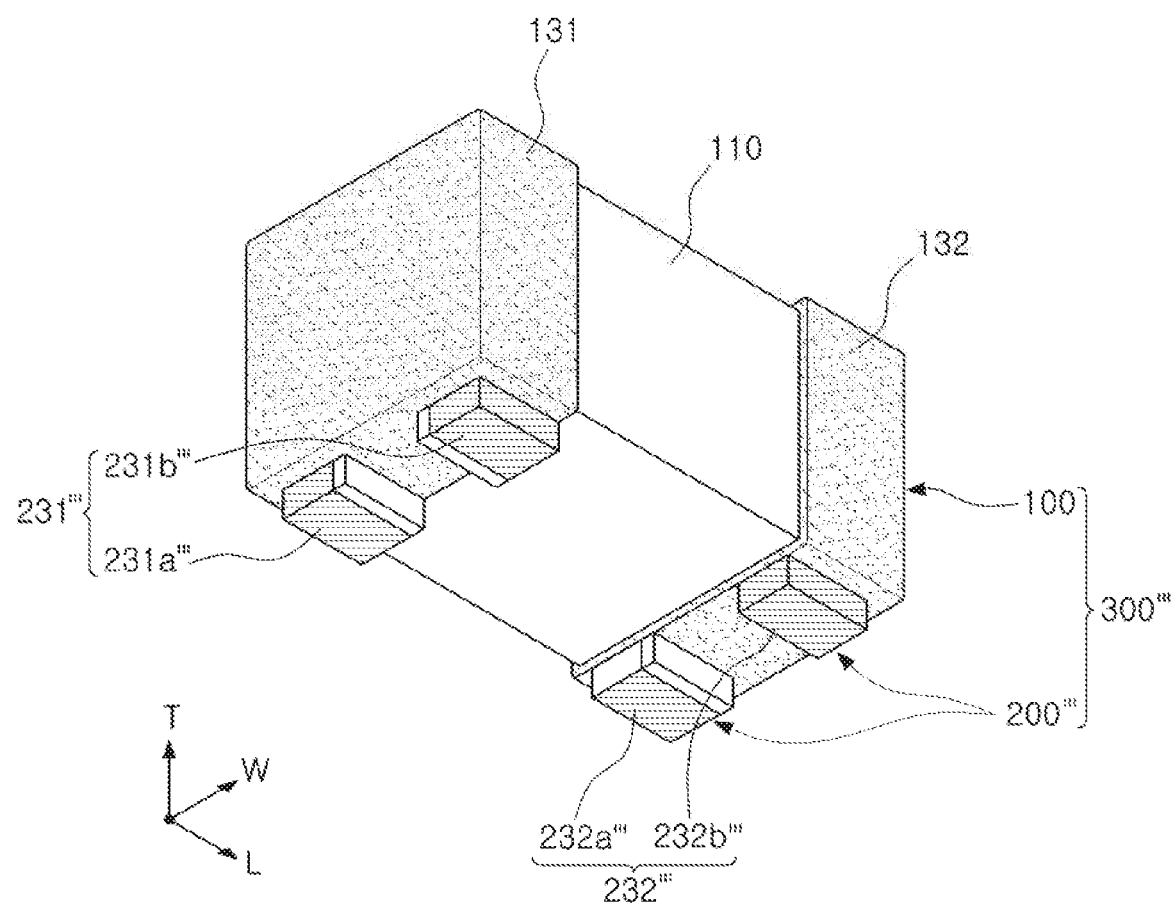
FIG. 6 is a schematic diagram of a composite electronic component according to a fifth exemplary embodiment of the present disclosure.

FIG. 6 is a schematic diagram of a composite electronic component according to a fifth exemplary embodiment of the present disclosure.

Referring to FIG. 6, a composite electronic component 300''' according to the fifth exemplary embodiment may include a pair of first terminal electrodes 231''', 231a''', and 231b''' connected to the first external electrode 131 and including a substrate 200''' disposed therein and a pair of second terminal electrodes 232''', 232a''', and 232b''' connected to the second external electrode 132 and including the substrate 200''' disposed therein, which are disposed below the multilayer ceramic capacitor 100 and, in this case, the first and second terminal electrodes may be disposed on a partial portion of the substrate disposed therein.

That is, a width of a region in which the first terminal electrodes 231''', 231a''', and 231b''' and the second terminal electrodes 232''', 232a''', and 232b''' are disposed may be smaller than a width of the internal substrate 200'''.

The width of the region in which the first terminal electrodes 231''', 231a''', and 231b''' and the second terminal electrodes 232''', 232a''', and 232b''' are disposed is smaller than the width of the internal substrate 200''' and, thus, vibrations at the first terminal electrodes 231''', 231a''', and 231b''' and the second terminal electrodes 232''', 232a''', and 232b''' may not be transferred to the internal substrate 200''', thereby effectively preventing acoustic noise from being generated.

In addition, the width of the region in which the first terminal electrodes 231''', 231a''', and 231b''' and the second terminal electrodes 232''', 232a''', and 232b''' are disposed is smaller than the width of the internal substrate 200''' and, thus, solder may be easily filled in a space formed between the first terminal electrodes 231''', 231a''', and 231b''' and the second terminal electrodes 232''', 232a''', and 232b''' and, thus, may be prevented from being formed along the external electrodes 131 and 132 of the multilayer ceramic capacitor 100.

Installation Substrate of Composite Electronic Component

Figure 7:
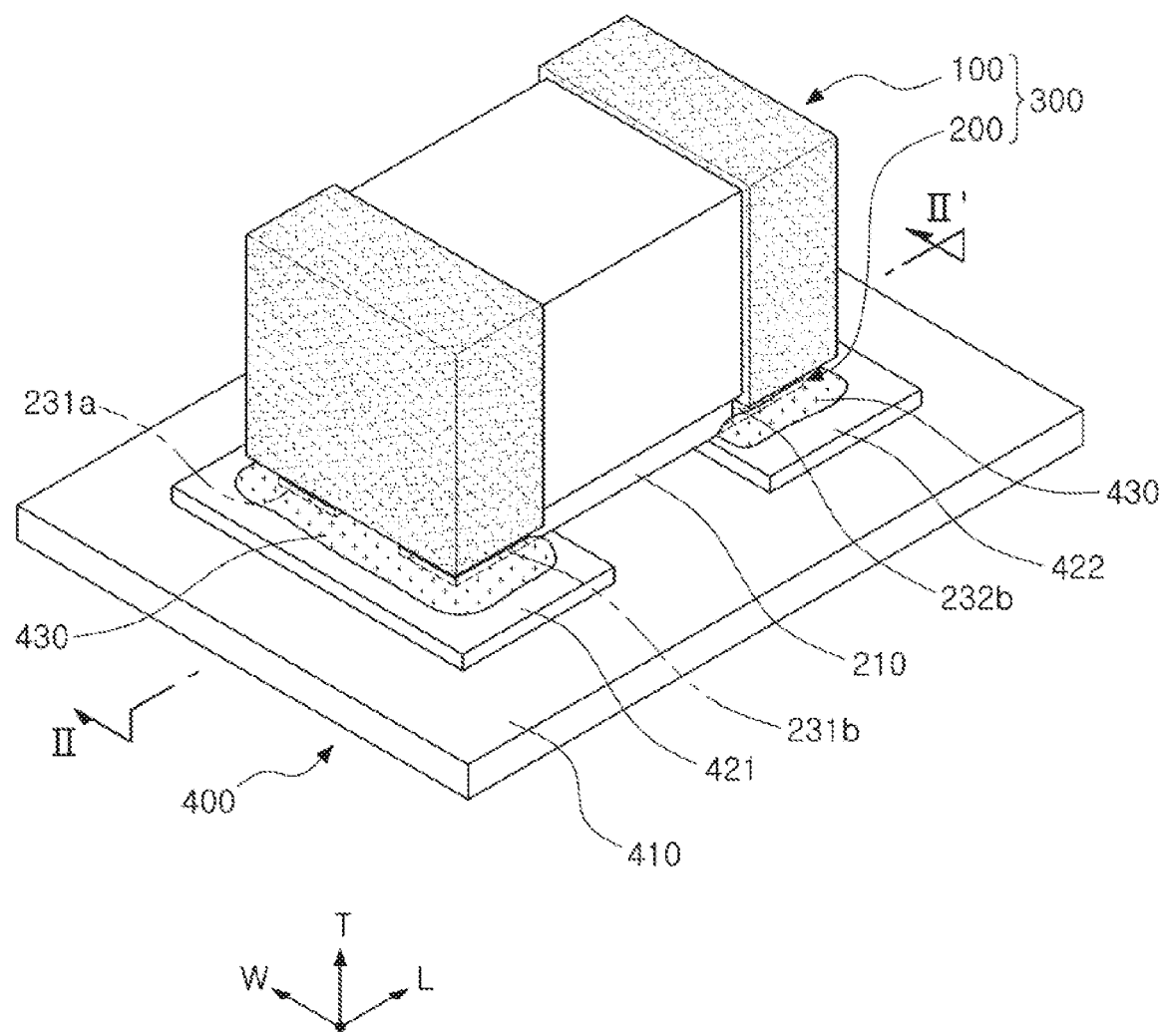
FIG. 7 is a perspective view showing the case in which the composite electronic component of FIG. 1 is installed on a printed circuit board.

FIG. 7 is a perspective view showing the case in which the composite electronic component of FIG. 1 is installed on a printed circuit board.

Figure 8:
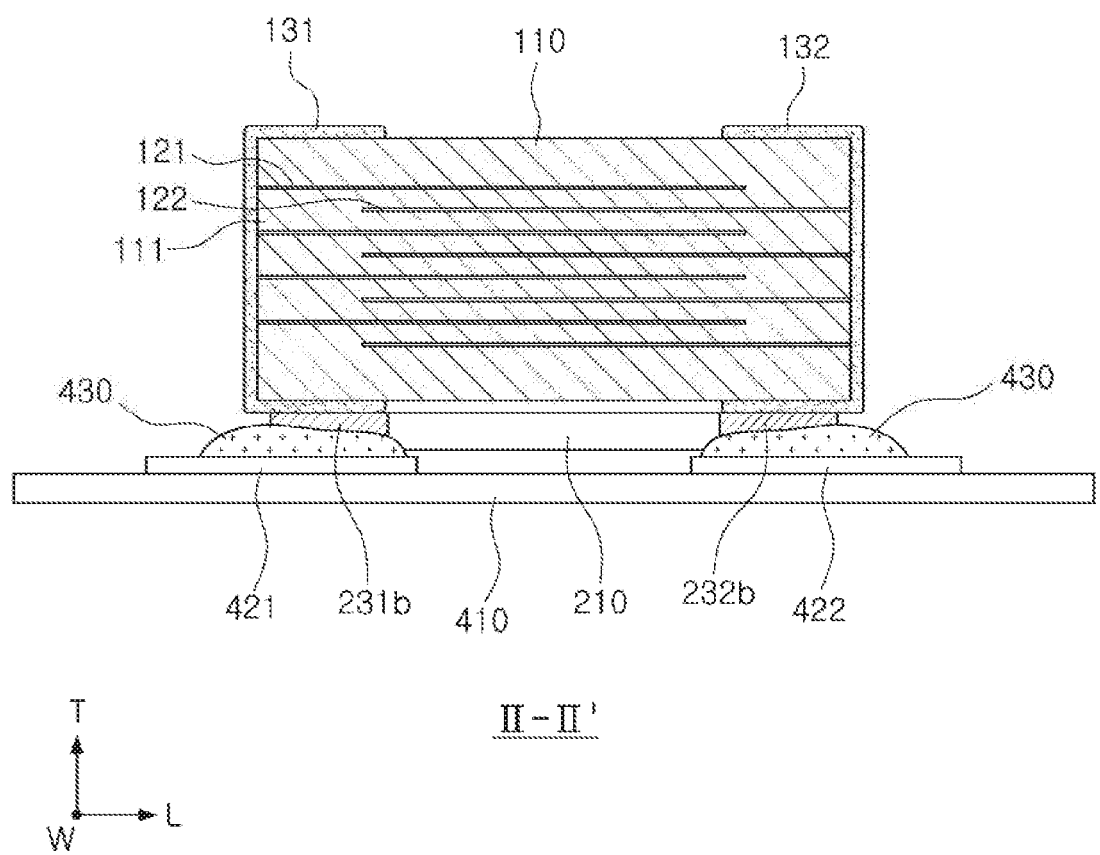
FIG. 8 is a cross-sectional view showing the case in which the composite electronic component of FIG. 7 is installed on a circuit board, taken in the longitudinal direction.

FIG. 8 is a cross-sectional view showing the case in which the composite electronic component of FIG. 7 is installed on a circuit board, taken in the longitudinal direction.

Referring to FIGS. 7 and 8, an installation substrate 400 of a composite electronic component according to the present embodiment may include a printed circuit board 410 on which the composite electronic component is installed, and two electrode pads 421 and 422 formed on an upper surface of the printed circuit board 410.

The electrode pads 421 and 422 may include the first and second electrode pads 421 and 422 connected to the first terminal electrodes 231a and 231b and the second terminal electrodes 232a and 232b of the pair of substrates 200 of the composite electronic component, respectively.

In this case, the first and second terminal electrodes 231 and 232 of the pair of substrates 200 may be electrically connected to the printed circuit board 410 via solder 430 while contacting upper portions of the first and second electrode pads 421 and 422.

As such, when the composite electronic component is installed on the printed circuit board 410, if a voltage is applied, acoustic noise may be generated.

That is, when voltages with different polarities are applied to the first external electrode 131 and the second external electrode 132 disposed on opposite lateral surfaces in the longitudinal direction of the multilayer ceramic capacitor 100 of the composite electronic component in a state in which the composite electronic component is installed on the printed circuit board 410, the ceramic body expands and contracts in the thickness direction according to an inverse piezoelectric effect of the dielectric layers 111, and opposite lateral surface portions of the first external electrode 131 and the second external electrode 132 contract and expand according to the Poisson effect, oppositely to expansion and contraction of the first ceramic body.

Here, in the case of the composite electronic component according to an exemplary embodiment of the present disclosure, although an amount of solder used to install the composite electronic component on a printed circuit board is large, the solder may be prevented from being formed along the first and second external electrodes 131 and 132 of the multilayer ceramic capacitor 100 and, thus, piezoelectric stress may be prevented from being transferred directly to a circuit board through the first and second external electrodes 131 and 132 from the multilayer ceramic capacitor 100, thereby enhancing an effect of reducing acoustic noise.

That is, when the composite electronic component is installed on a substrate, transfer of vibrations of a capacitor due to converse piezoelectricity to the substrate may be reduced, thereby reducing acoustic noise.

As set forth above, according to an exemplary embodiment in the present disclosure, stress or vibrations due to piezoelectricity of a multilayer ceramic capacitor may be alleviated by a pair of substrates spaced apart from each other below the multilayer ceramic capacitor, thereby reducing amplitude of acoustic noise generated by a circuit board.

The ceramic body of the multilayer ceramic capacitor may include an active region in which capacity is formed stacking a dielectric layer and an internal electrode and upper and lower cover layers formed above and below the active region in the thickness direction, where a lower thickness-direction portion is thicker than an upper thickness-direction portion and, thus, transfer of stress and vibrations generated from the multilayer ceramic capacitor may be minimized, thereby reducing acoustic noise.

A space formed in the longitudinal direction of the ceramic body may be formed between the pair of substrates and, thus, solder may be prevented from being formed in the thickness of the multilayer ceramic capacitor, thereby minimizing transfer of vibrations to the substrate via solder.

While exemplary embodiments have been shown and described above, it will be apparent to those skilled in the art that modifications and variations could be made without departing from the scope of the present disclosure as defined by the appended claims.

What is claimed is:

1. A composite electronic component comprising:
   a multilayer ceramic capacitor including a ceramic body comprising a plurality of dielectric layers and a plurality of internal electrodes facing each other with a dielectric layer interposed therebetween and first and second external electrodes disposed on opposing end portions of the ceramic body;
   first and second insulating substrates spaced apart from a lower portion of the multilayer ceramic capacitor and spaced apart from each other, each of the first and second insulating substrates including first and second end portions and a connection portion extending between the first and second end portions;
   first terminal electrodes respectively connected to the first external electrode, respectively disposed on the first end portion of the first insulating substrate and the first end portion of the second insulating substrate, and spaced apart from each other; and
   second terminal electrodes respectively connected to the second external electrode, respectively disposed on the second end portion of the first insulating substrate and the second end portion of the second insulating substrate, and spaced apart from each other.

2. The composite electronic component of claim 1, wherein a space is formed in a longitudinal direction of the ceramic body between the first and second insulating substrates.

3. The composite electronic component of claim 1, wherein the first and second insulating substrates are spaced apart from each other in a width direction of the ceramic body.

4. The composite electronic component of claim 1, wherein the internal electrodes are stacked perpendicularly or horizontally with respect to a mounting surface of the composite electronic component.

5. The composite electronic component of claim 1, wherein the ceramic body includes an active region including the internal electrodes being disposed to face each other with the dielectric layer interposed therebetween and upper and lower cover layers respectively disposed above and below the active region in a thickness direction, wherein the lower cover layer in the thickness direction is thicker than the upper cover layer in the thickness direction.

6. The composite electronic component of claim 1, wherein the first and second terminal electrodes are entirely disposed on the first and second end portions of each of the first and second insulating substrates.

7. The composite electronic component of claim 1, wherein the first and second terminal electrodes are partially disposed on the first and second end portions of each of the first and second insulating substrates.

8. The composite electronic component of claim 1, wherein, in each of the first and second insulating substrates, a width of a region in which the first and second terminal electrodes are disposed is greater than a width of an internal region in which the first and second terminal electrodes are not disposed.

9. The composite electronic component of claim 1, further comprising:
   third and fourth insulating substrates disposed on a surface of the multilayer ceramic capacitor opposite to the surface of the multilayer ceramic capacitor, on which the first and second insulating substrates are disposed, the third and fourth insulating substrates being spaced apart from each other, each of the third and fourth insulating substrates including third and fourth end portions and a connection portion extending between the third and fourth end portions;
   third terminal electrodes respectively connected to the first external electrode, respectively disposed on the third end portion of the third insulating substrate and the third end portion of the fourth insulating substrate, and spaced apart from each other; and
   fourth terminal electrodes respectively connected to the second external electrode, respectively disposed on the fourth end portion of the third insulating substrate and the fourth end portion of the fourth insulating substrate, and spaced apart from each other.

10. The composite electronic component of claim 9, wherein the third and fourth terminal electrodes are partially disposed on the third and fourth end portions of the third and fourth insulating substrates.

11. A composite electronic component comprising:
    a multilayer ceramic capacitor including a ceramic body comprising a plurality of dielectric layers and a plurality of internal electrodes facing each other with a dielectric layer interposed therebetween and first and second external electrodes disposed on opposing end portions of the ceramic body; and
    a pair of first terminal electrodes connected to a first external electrode, and including a first substrate disposed therein, and a pair of second terminal electrodes connected to the second external electrodes and including a second substrate disposed therein, the pair of first terminal electrodes and the pair of second terminal electrodes being disposed below the multilayer ceramic capacitor,
    wherein the first and second terminal electrodes are entirely disposed on an end portion of the substrate disposed therein.

12. The composite electronic component of claim 11, wherein the internal electrodes are stacked perpendicularly or horizontally with respect to a mounting surface of the composite electronic component.

13. The composite electronic component of claim 11, wherein the ceramic body includes an active region including the internal electrodes being disposed to face each other with the dielectric layer interposed therebetween and upper and lower cover layers respectively disposed above and below the active region in a thickness direction, wherein the lower cover layer in the thickness direction is thicker than the upper cover layer in the thickness direction.

14. A composite electronic component comprising:
    a body including first internal electrodes and second internal electrodes disposed on dielectric layers included in the body and stacked on top of each other in a thickness direction, the first and second internal electrodes being alternately exposed respectively to first and second external electrodes disposed on end portions of the body opposing in a length direction;

a pair of first terminal electrodes, each comprising a first insulating substrate and a first conductive terminal, connected to the first external electrode, the pair of first terminal electrodes being disposed on a bottommost surface of the body in the thickness direction and being spaced apart from each other; and a pair of second terminal electrodes, each comprising a second substrate and a second conductive terminal, connected to the second external electrode, the pair of second terminal electrodes being disposed on the bottommost surface of the body in the thickness direction and being spaced apart from each other, wherein the first insulating substrates and the second insulating substrates are spaced apart from each other, the first insulating substrates, on which the first conductive terminals are respectively disposed, respectively include side surfaces facing each other and exposed from the first conductive terminals, the first conductive terminals are spaced apart from edges of the side surfaces of the first insulating substrates facing each other, the second insulating substrates, on which the second conductive terminals are respectively disposed, respectively include side surfaces facing each other and exposed from the second conductive terminals, and the second conductive terminals are spaced apart from edges of the side surfaces of the second insulating substrates facing each other.

15. The composite electronic component of claim 14, wherein a width of each of the first and second insulating substrates corresponding each of the first and second terminal electrodes is greater than the corresponding conductive terminal.

16. The composite electronic component of claim 14, wherein a portion of the first and second external electrodes is disposed on the bottommost surface of the body, and the pairs of the first and second terminal electrodes are disposed on corresponding portions of the first and second external electrodes disposed on the bottommost surface of the body.

17. The composite electronic component of claim 14, wherein the internal electrodes are stacked perpendicularly or horizontally with respect to a mounting surface of the composite electronic component.

18. The composite electronic component of claim 14, wherein the ceramic body includes an active region including the internal electrodes being disposed to face each other with the dielectric layer interposed therebetween and upper and lower cover layers respectively disposed above and below the active region in a thickness direction, wherein the lower cover layer in the thickness direction is thicker than the upper cover layer in the thickness direction.

* * * * *